(12) United States Patent
Yabu et al.

(10) Patent No.: US 8,193,608 B2
(45) Date of Patent: Jun. 5, 2012

(54) SEMICONDUCTOR DEVICE

(75) Inventors: Hiroaki Yabu, Kyoto (JP); Toshihiro Kogami, Kyoto (JP); Katsuya Arai, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/195,648

(22) Filed: Aug. 1, 2011

(65) Prior Publication Data

US 2011/0284963 A1 Nov. 24, 2011

Related U.S. Application Data

(62) Division of application No. 11/968,327, filed on Jan. 2, 2008, now Pat. No. 8,035,229.

(30) Foreign Application Priority Data

Mar. 1, 2007 (JP) ................................. 2007-051672

(51) Int. Cl.
*H01L 29/66* (2006.01)
(52) U.S. Cl. ........ 257/565; 257/575; 257/775; 257/786; 257/E29.031; 257/E29.114
(58) Field of Classification Search .................. 257/565, 257/575, 773, 774, 775, 786, E29.031, E29.034, 257/E29.112, E29.114
See application file for complete search history.

(56) References Cited

U.S. PATENT DOCUMENTS

| | | | |
|---|---|---|---|
| 5,923,079 | A | 7/1999 | Narita et al. |
| 6,389,583 | B1 | 5/2002 | Yamazaki |
| 6,414,341 | B1 | 7/2002 | Horiguchi |
| 6,750,517 | B1 | 6/2004 | Ker et al. |
| 7,405,443 | B1 | 7/2008 | Zuniga et al. |
| 2001/0013611 | A1 | 8/2001 | Minami et al. |
| 2004/0124473 | A1 | 7/2004 | Maloney et al. |
| 2005/0093073 | A1 | 5/2005 | Baird et al. |
| 2008/0265330 | A1 | 10/2008 | Gerhardt et al. |

FOREIGN PATENT DOCUMENTS

| | | |
|---|---|---|
| JP | 02-271673 | 11/1990 |
| JP | 4-010473 A | 1/1992 |
| JP | 4-093036 A | 3/1992 |
| JP | 10-074893 A | 3/1998 |
| JP | 2000-040821 A | 2/2000 |
| JP | 2001-110907 A | 4/2001 |
| JP | 2001-339046 A | 12/2001 |

*Primary Examiner* — Evan Pert
*Assistant Examiner* — Eduardo A Rodela
(74) *Attorney, Agent, or Firm* — McDermott Will & Emery LLP

(57) ABSTRACT

A semiconductor device includes: a gate electrode formed above a semiconductor region; a drain region and a source region formed in portions of the semiconductor region located below sides of the gate electrode in a gate length direction, respectively; a plurality of drain contacts formed on the drain region to be spaced apart in a gate width direction of the gate electrode; and a plurality of source contacts formed on the source region to be spaced apart in the gate width direction of the gate electrode. The intervals between the drain contacts are greater than the intervals between the source contacts.

13 Claims, 12 Drawing Sheets

SEMICONDUCTOR DEVICE

CROSS-REFERENCE TO RELATED APPLICATIONS

This application is a Divisional of U.S. application Ser. No. 11/968,327, filed on Jan. 2, 2008, now U.S. Pat. No. 8,035,229 which claims priority under 35 U.S.C. §119 on Patent Application No. 2007-51672, filed in Japan on Mar. 1, 2007, the entire contents of each of which are hereby incorporated by reference.

BACKGROUND OF THE INVENTION (a) Fields of the Invention

The present invention relates to semiconductor devices. In particular, the present invention relates to semiconductor devices having transistors for electrostatic discharge (ESD) protection.

(b) Description of Related Art

In recent years, in semiconductor integrated circuit devices, elements therein have become finer and denser, and thus a high degree of integration thereof has been proceeding. Accompanied with this trend, the devices become sensitive to damages caused by electrostatic discharge (referred hereinafter to as surge). For example, there is a growing possibility that surge entering from a pad for external connection breaks elements included in an input circuit, an output circuit, an input/output circuit, and in addition an internal circuit and the like and thus performances of the elements are degraded. To avoid this possibility, in the semiconductor integrated circuit device, an electrostatic discharge (ESD) protection transistor for protecting the device against surge as disclosed in, for example, Japanese Unexamined Patent Publication No. H2-271673 is provided between the external connection pad and the input circuit, the output circuit, the input/output circuit, or the internal circuit.

FIGS. 17A and 17B are views of a conventional ESD protection transistor. FIG. 17A shows a plan structure thereof, and FIG. 17B shows a cross-sectional structure taken along the line XVIIb-XVIIb in FIG. 17A.

Referring to FIGS. 17A and 17B, an ESD protection transistor 50 includes: a well region 1 formed in an upper portion of a semiconductor substrate (not shown); a gate electrode 3 formed above the well region 1 with a gate oxide film 2 interposed therebetween; a drain region 4 as a high-concentration impurity diffusion layer formed in a portion of the well region 1 located below one side of the gate electrode 3; and a source region 5 as a high-concentration impurity diffusion layer formed in a portion of the well region 1 located below the other side of the gate electrode 3.

The drain region 4 is connected through a plurality of drain contacts 6A to 6E to a metal interconnect 8. The plurality of drain contacts 6A to 6E are formed in an interlayer insulating film 10, and the metal interconnect 8 makes connection to, for example, an input/output terminal (a pad for external connection) 11. The source region 5 is connected through a plurality of source contacts 7A to 7E to a metal interconnect 9. The plurality of source contacts 7A to 7E are formed in the interlayer insulating film 10, and the metal interconnect 9 makes connection to a reference voltage terminal (for example, a ground terminal or a power supply terminal) 12.

The plurality of drain contacts 6A to 6E and the plurality of source contacts 7A to 7E are spaced apart in the gate width direction, respectively. The drain contacts 6A to 6E and the source contacts 7A to 7E have the same intervals, and are formed to face each other with the gate electrode 3 interposed therebetween. Thus, as shown in FIG. 17B, the cross section of the gate electrode 3 taken along the gate length direction contains both of the drain contact 6C and the source contact 7C.

In the ESD protection transistor 50, when surge enters from the input/output terminal 11 connected to the drain region 4, the ESD protection transistor 50 is activated. In response to this, the surge entering from the outside is dissipated to the reference voltage terminal 12 connected to the source region 5, which enables protection of the internal circuit of the device.

In order for the conventional ESD protection transistor 50 to ensure a high ESD tolerance, for example, the current capability (the current-handling capability) of the order of amperes is required with respect to the surge applied for 100 ns or less.

To allow a current of the order of amperes to flow through the ESD protection transistor, a plurality of drain contacts and a plurality of source contacts should be arranged in the transistor width (gate width) direction for the purpose of preventing possible breaks in the contacts due to electromigration and stress migration.

To deal with this challenge, one of conventionally-employed methods for arranging a plurality of contacts both in the drain region and the source region of the ESD protection transistor is a method for arranging the contacts to keep a design rule minimum (D.R.M.) for contacts.

When the intervals between the contacts are narrowed, the parasitic resistance between the drain contacts adjoining in the transistor width (gate width) direction decreases. As a result of this, for example, currents from the drain contacts 6B and 6D easily enter a current flowing between the drain contact 6C and the source contact 7C. Thus, such local concentration of surge current on the source contact 7C causes thermal breakdown of the transistor, which disadvantageously results in degradation of the ESD tolerance of the device.

SUMMARY OF THE INVENTION

In view of the conventional problems described above, an object of the present invention is to improve the ESD tolerance of an ESD protection transistor included in a semiconductor device.

To attain the above object, a semiconductor device according to the present invention is designed so that the intervals between contacts of an electrostatic discharge (ESD) protection transistor are set at a higher value than a design rule minimum.

To be more specific, a first semiconductor device according to the present invention is characterized in that the device includes: at least one gate electrode formed above a semiconductor region; a drain region and a source region formed in portions of the semiconductor region located below sides of the gate electrode in a gate length direction, respectively; a plurality of drain contacts formed on the drain region to be spaced apart in a gate width direction of the gate electrode; and a plurality of source contacts formed on the source region to be spaced apart in the gate width direction of the gate electrode, and the intervals between the drain contacts are greater than the intervals between the source contacts.

With the first semiconductor device, the intervals between the drain contacts are greater than the intervals between the source contacts. This provides an increased resistance between the adjacent ones of the drain contacts. Thus, the phenomenon in which a current from a drain contact enters a current flowing between another drain contact and a source contact that face each other is inhibited. As a result of this, local current concentration on a pair of drain and source contacts can be prevented to improve the ESD tolerance of a transistor for electrostatic discharge protection.

Preferably, in the first semiconductor device, the intervals between the source contacts are greater than the minimum interval in design rules.

A second semiconductor device according to the present invention is characterized in that the device includes: a first transistor for electrostatic discharge protection; and a second transistor constituting a logic circuit, the first transistor includes: at least one gate electrode formed above a first semiconductor region; a drain region and a source region formed in portions of the first semiconductor region located below sides of the gate electrode in a gate length direction, respectively; a plurality of drain contacts formed on the drain region to be spaced apart in a gate width direction of the gate electrode; and at least one source contact formed on the source region, the second transistor includes: a first diffusion region and a second diffusion region formed in a second semiconductor region; a plurality of first contacts formed to be spaced apart on the first diffusion region; and a plurality of second contacts formed to be spaced apart on the second diffusion region, and the intervals between the drain contacts are greater than the intervals between the first contacts and between the second contacts.

With the second semiconductor device, the intervals between the drain contacts of the first transistor for electrostatic discharge protection are greater than the intervals between the first contacts and between the second contacts of the second transistor constituting a logic circuit. This provides an increased resistance between the adjacent ones of the drain contacts. Thus, the phenomenon in which a current from a drain contact enters a current flowing between another drain contact and a source contact that face each other is inhibited. As a result of this, local current concentration on a pair of drain and source contacts can be prevented to improve the ESD tolerance of the first transistor for electrostatic discharge protection.

Preferably, in the second semiconductor device, the at least one source contact comprises a plurality of source contacts, and the plurality of source contacts are formed to be spaced apart in the gate width direction of the gate electrode, and the intervals between the source contacts are greater than the intervals between the first contacts and between the second contacts.

Preferably, in the first or second semiconductor device, the plurality of drain contacts are aligned in multiple lines in parallel with the gate width direction.

Preferably, in the first or second semiconductor device, the plurality of source contacts are aligned in multiple lines in parallel with the gate width direction.

Preferably, in the first or second semiconductor device, the drain contacts and the source contacts are formed so that with the gate electrode interposed therebetween, the drain contacts do not face the source contacts.

Preferably, in the first or second semiconductor device, the at least one gate electrode comprises a plurality of gate electrodes, and the plurality of gate electrodes are formed between the drain region and the source region.

A third semiconductor device according to the present invention is characterized in that the device includes: a well region of a first conductivity type formed in a semiconductor region; a collector region of a second conductivity type and an emitter region of the second conductivity type formed in the well region; a plurality of collector contacts formed on the collector region to be spaced apart in a width direction of a transistor; and a plurality of emitter contacts formed on the emitter region to be spaced apart in the transistor width direction, and the intervals between the collector contacts are greater than the intervals between the emitter contacts.

With the third semiconductor device, the intervals between the collector contacts are greater than the intervals between the emitter contacts. This provides an increased resistance between the adjacent ones of the collector contacts. Thus, the phenomenon in which a current from a collector contact enters a current flowing between another collector contact and an emitter contact that face each other is inhibited. As a result of this, local current concentration on a pair of collector and emitter contacts can be prevented to improve the ESD tolerance of a transistor for electrostatic discharge protection.

Preferably, in the third semiconductor device, the intervals between the emitter contacts are greater than the minimum interval in design rules.

A fourth semiconductor device according to the present invention is characterized in that the device includes: a first transistor for electrostatic discharge protection; and a second transistor constituting a logic circuit, the first transistor includes: a well region of a first conductivity type formed in a first semiconductor region; a collector region of a second conductivity type and an emitter region of the second conductivity type formed in the well region; a plurality of collector contacts formed on the collector region to be spaced apart in a width direction of a transistor; and at least one emitter contact formed on the emitter region; the second transistor includes: a first diffusion region and a second diffusion region formed in a second semiconductor region; a plurality of first contacts formed to be spaced apart on the first diffusion region; and a plurality of second contacts formed to be spaced apart on the second diffusion region, and the intervals between the collector contacts are greater than the intervals between the first contacts and between the second contacts.

With the fourth semiconductor device, the intervals between the collector contacts of the first transistor for electrostatic discharge protection are greater than the intervals between the first contacts and between the second contacts of the second transistor constituting a logic circuit. This provides an increased resistance between the adjacent ones of the collector contacts. Thus, the phenomenon in which a current from a collector contact enters a current flowing between another collector contact and an emitter contact that face each other is inhibited. As a result of this, local current concentration on a pair of collector and emitter contacts can be prevented to improve the ESD tolerance of the first transistor for electrostatic discharge protection.

Preferably, in the fourth semiconductor device, the at least one emitter contact comprises a plurality of emitter contacts, and the plurality of emitter contacts are formed to be spaced apart in the transistor width direction, and the intervals between the emitter contacts are greater than the intervals between the first contacts and between the second contacts.

Preferably, in the third or fourth semiconductor device, the plurality of collector contacts are aligned in multiple lines in parallel with the transistor width direction.

Preferably, in the third or fourth semiconductor device, the plurality of emitter contacts are aligned in multiple lines in parallel with the transistor width direction.

BRIEF DESCRIPTION OF THE DRAWINGS

FIG. 1A is a schematic plan view thereof, FIG. 1B is a sectional view thereof taken along the line Ib-Ib in FIG. 1A, and FIG. 1C is a sectional view thereof taken along the line Ic-Ic in FIG. 1A.

FIG. 10A is a schematic plan view thereof, FIG. 10B is a sectional view thereof taken along the line Xb-Xb in FIG. 10A, and FIG. 10C is a sectional view thereof taken along the line Xc-Xc in FIG. 10A.

FIG. 17A is a schematic plan view thereof, and FIG. 17B is a sectional view taken along the line XVIIb-XVIIb in FIG. 17A.

BEST MODE FOR CARRYING OUT THE INVENTION

First Embodiment

A first embodiment of the present invention will be described with reference to the accompanying drawings.

Figure 1A:
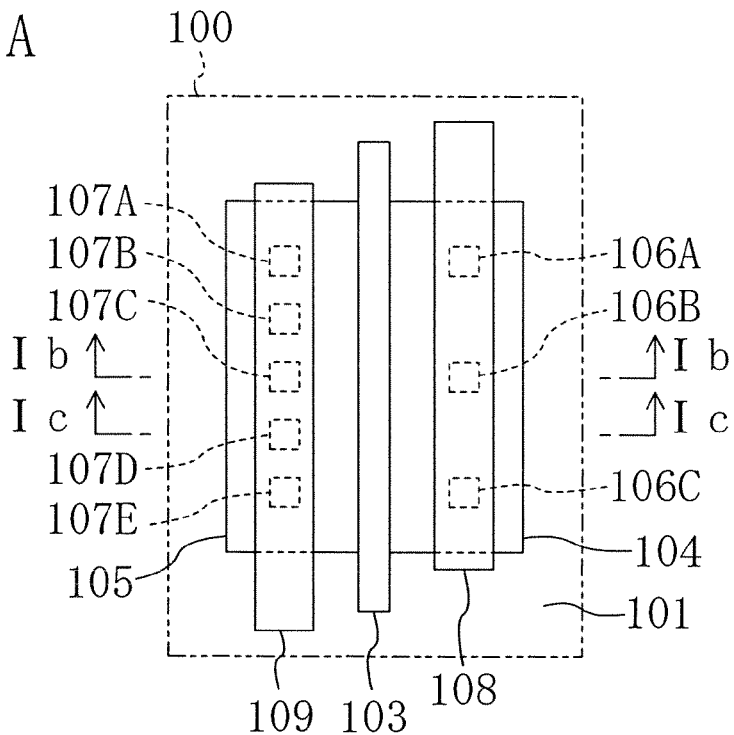
FIGS. 1A to 1C show an electrostatic discharge (ESD) protection transistor according to a first embodiment of the present invention.
Figure 1B:
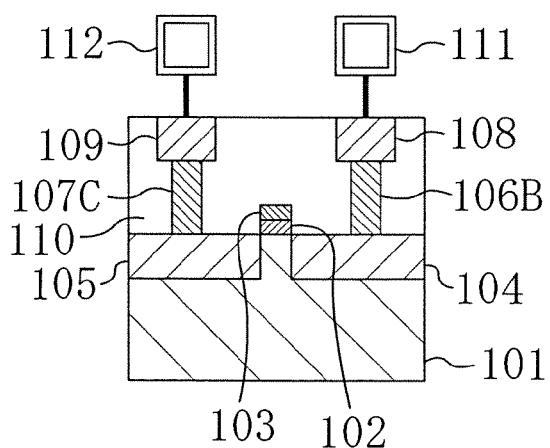
Figure 1C:
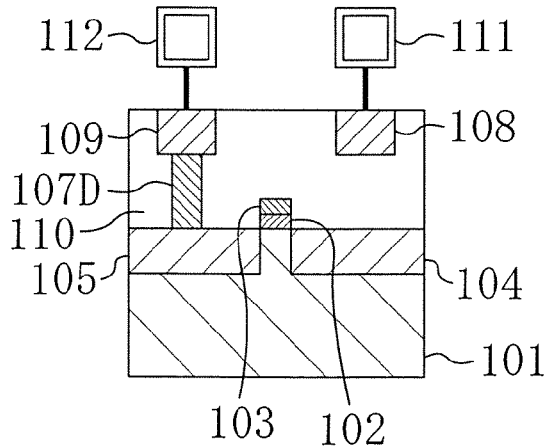

FIGS. 1A to 1C show an electrostatic discharge (ESD) protection transistor according to the first embodiment of the present invention. FIG. 1A shows a plan structure thereof, FIG. 1B shows a cross-sectional structure thereof taken along the line Ib-Ib in FIG. 1A, and FIG. 1C shows a cross-sectional structure thereof taken along the line Ic-Ic in FIG. 1A.

Referring to FIGS. 1A to 1C, an ESD protection transistor 100 according to the first embodiment is formed of an n-type MIS (metal insulator semiconductor) transistor, and includes a p-type well region 101, a gate electrode 103, an n-type drain region 104, and an n-type source region 105. The p-type well region 101 is formed in the upper portion of a semiconductor substrate (not shown) made of silicon or the like. The gate electrode 103 of polysilicon is formed above the well region 101 with a gate insulating film 102 of silicon oxide or silicon oxynitride interposed therebetween. The n-type drain region 104 is formed in a portion of the well region 101 located below one side of the gate electrode 103 in the gate length direction. The n-type source region 105 is formed in a portion of the well region 101 located below the other side of the gate electrode 103. In these figures, for ease of illustration, graphic representation and description of an n-type extension region, sidewalls on the sides of the gate electrode, silicide layers on the gate electrode and the source and drain regions, and the like are omitted.

The well region 101 is formed by ion implantation of p-type impurity ions, and has an impurity concentration of $1 \times 10^{17}$ cm$^{-3}$ to $7 \times 10^{17}$ cm$^{-3}$. The drain region 104 and the source region 105 are formed, for example, by ion implantation of n-type impurity ions if the transistor belongs to the generation with 65 nm-design rules, and have an impurity concentration of $1 \times 10^{17}$ cm$^{-3}$ to $1 \times 10^{18}$ cm$^{-3}$.

The drain region 104 is connected through a plurality of drain contacts 106A to 106C to a first metal interconnect 108. The plurality of drain contacts 106A to 106C are formed in an interlayer insulating film 110, and the first metal interconnect 108 makes connection to, for example, an input/output terminal (a pad for external connection) 111.

The source region 105 is connected through a plurality of source contacts 107A to 107E to a second metal interconnect 109. The plurality of source contacts 107A to 107E are formed in the interlayer insulating film 110, and the second metal interconnect 109 makes connection to a reference voltage terminal (for example, a ground terminal or a power supply terminal) 112.

The plurality of drain contacts 106A to 106C and the plurality of source contacts 107A to 107E are spaced apart in the gate width direction of the gate electrode 103. The intervals between the drain contacts 106A to 106C are set at a value greater than the design rule minimum (D.R.M.) of the contact, for example, 0.09 µm and not greater than five times the minimum, that is, 0.45 µm. In contrast to this, the intervals between the source contacts 107A to 107E are set at a minimum contact interval, that is, 0.09 µm. Note that the adjacent intervals between the drain contacts 106A to 106C preferably range from 1.1 to 5 times the design rule minimum.

For example, the drain contacts 106A to 106C and the source contacts 107A to 107E each have a tungsten plug structure in which the contact hole is filled with tungsten (W) with a barrier film of titanium (Ti)/titanium nitride (TiN) interposed therebetween.

The first and second metal interconnects 108 and 109 each have a damascene structure in which an interconnect groove provided in the interlayer insulating film 110 is filled with copper with a barrier film of tantalum nitride (TaN) interposed therebetween.

In the first embodiment, the intervals between the drain contacts 106A to 106C are different from the intervals between the source contacts 107A to 107E. Therefore, the cross section of the source contact 107C taken along the gate length direction shown in FIG. 1B contains the drain contact 106B, while the cross section of the source contact 107D taken along the gate length direction shown in FIG. 1C contains no drain contact.

In the first embodiment, the adjacent intervals between the plurality of drain contacts 106A to 106C formed in the gate width direction are set at a value greater than the minimum for the contact design, for example, a value ranging from 1.1 to 5 times the minimum for the contact design. This provides an increased resistance between the adjacent ones of the drain contacts 106A to 106C. As a result of this, for example, a current from the drain contact 106A or 106C can be inhibited from entering a current flowing between the drain contact 106B and the source contact 107C, so that local current concentration on one source contact can be prevented.

Furthermore, in the first embodiment, only changing the intervals between the contacts can improve the ESD tolerance of the ESD protection transistor 100. Therefore, unlike the conventional example, it is unnecessary to provide an additional area for improving the ESD tolerance, and thus it is also unnecessary to prepare a mask for forming the additional area. Accordingly, a space-saving ESD protection transistor 100 can be provided at a low cost.

Figure 2A:
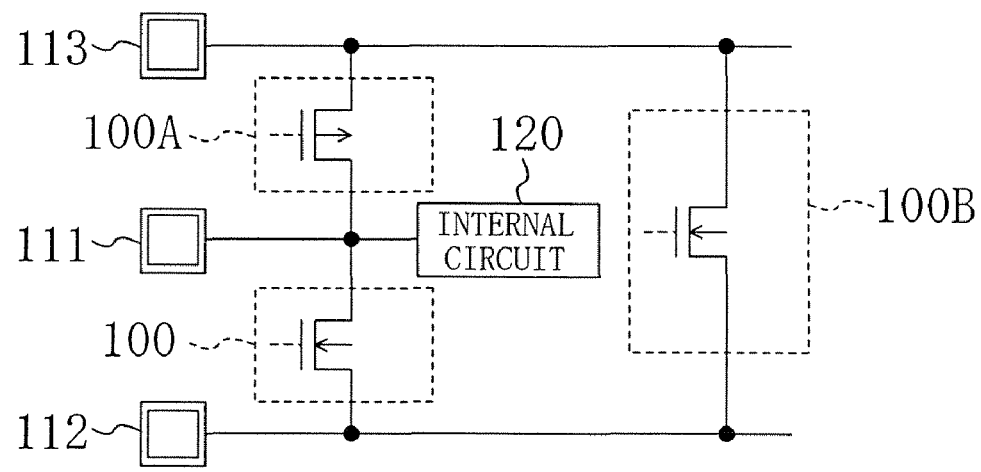
FIG. 2A is a circuit diagram showing main components of a semiconductor device including the ESD protection transistor according to the first embodiment of the present invention.

In the first embodiment, description has been made of the case where in the ESD protection transistor 100 formed of an n-type MIS transistor for protecting an internal circuit 120 in FIG. 2A from surge, the n-type drain region 104 is connected to the input/output terminal 111 and the n-type source region 105 is connected to the reference voltage terminal 112. However, the first embodiment is not limited to this case, and alternatively an ESD protection transistor formed of a p-type MIS transistor may also have the like structure. In this case, it is sufficient that in the structure shown in FIG. 1A, the conductivity types of the well region 101, the drain region 104, and the source region 105 are n-type, p-type, and p-type, respectively. For example, a configuration as shown in FIG. 2A may be employed in which a p-type MIS transistor serving as an ESD protection transistor 100A has a p-type source region 105 connected to a high-voltage terminal 113 and a p-type drain region 104 connected to the input/output terminal 111 and an n-type MIS transistor serving as an ESD protection transistor 100B has an n-type drain region 104 connected to the high-voltage terminal 113 and an n-type source region 105 connected to the reference voltage terminal 112.

Figure 2B:
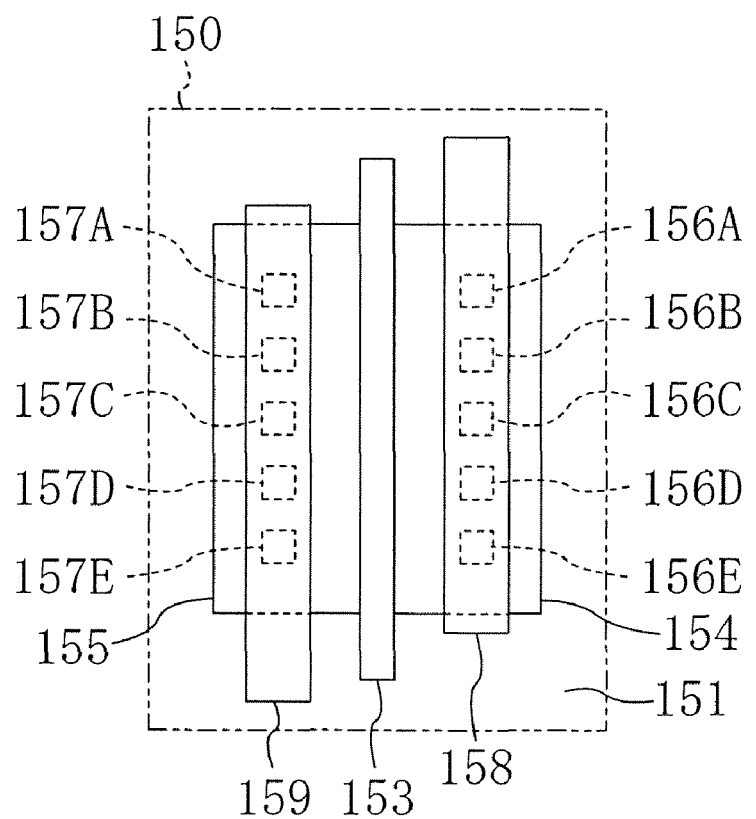
FIG. 2B is a plan view showing a transistor for a logic circuit constituting an internal circuit.

FIG. 2B shows a plan structure of a logic transistor 150 for, for example, a logic circuit incorporated into the internal circuit 120. Referring to FIG. 2B, the logic transistor 150 is formed of an n-type MIS transistor, and includes: a p-type well region 151 formed in the upper portion of the semiconductor substrate (not shown); a gate electrode 153 formed above the well region 151 with a gate insulating film interposed therebetween; an n-type drain region 154 formed in a portion of the well region 151 located below one side of the gate electrode 153; and an n-type source region 155 formed in a portion of the well region 151 located below the other side of the gate electrode 153.

In the drain region 154, a plurality of drain contacts 156A to 156E are formed in the gate width direction, and in the source region 155, a plurality of source contacts 157A to 157E are formed in the gate width direction. The top ends of the drain contacts 156A to 156E are connected to a first metal interconnect 158, and the top ends of the source contacts 157A to 157E are connected to a second metal interconnect 159.

In this structure, the adjacent intervals between the drain contacts 156A to 156E and between the source contacts 157A to 157E are both set at the design rule minimum for the contact, for example, 0.09 µm.

Figure 3:
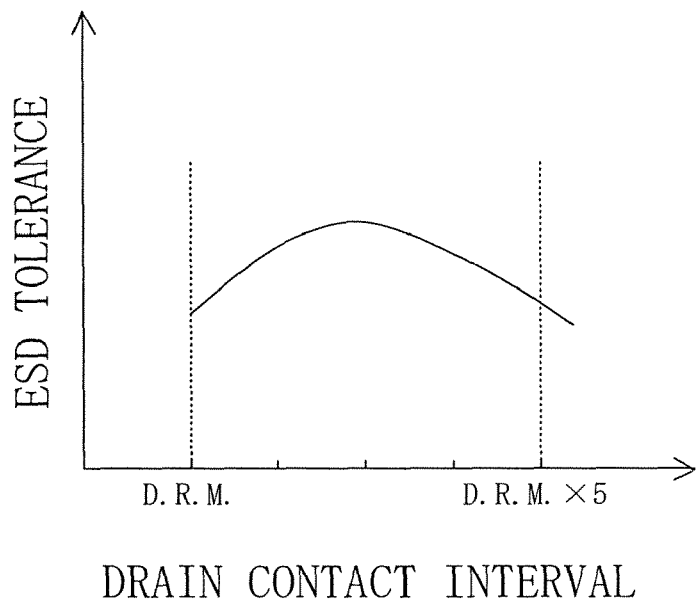
FIG. 3 is a graph showing the relation between the ESD tolerance level and the drain contact interval obtained from the ESD protection transistor according to the first embodiment of the present invention.

FIG. 3 is a graph showing the relation between the drain contact interval and the ESD tolerance obtained from the ESD protection transistor according to the first embodiment. In FIG. 3, the horizontal axis represents the interval between the drain contacts, and the vertical axis represents the ESD tolerance of the ESD protection transistor. In this graph, the ESD tolerance is measured in voltage or current. From FIG. 3, it is found that when the drain contact interval increases, an interval more than the design rule minimum (D.R.M.) for the contact and less than five times the minimum exhibits a higher ESD tolerance than the ESD tolerance obtained from the design rule minimum. Therefore, by setting the drain contact interval within the range from 1.1 to 5 times the design rule minimum for the contact, the ESD protection transistor 100 with a high ESD tolerance can be offered.

(First Modification of First Embodiment)

Figure 4:
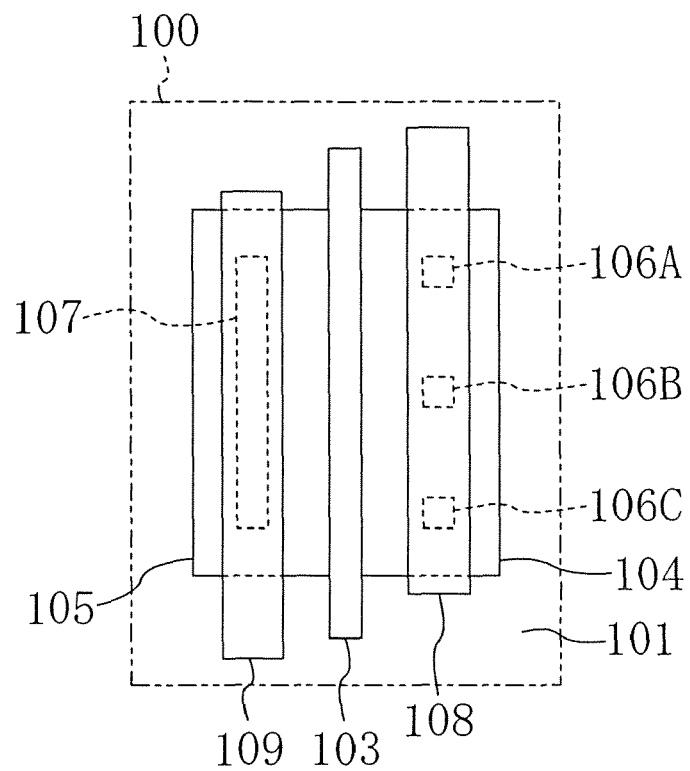
FIG. 4 is a schematic plan view showing an ESD protection transistor according to a first modification of the first embodiment of the present invention.

FIG. 4 shows a plan structure of an ESD protection transistor according to a first modification of the first embodiment of the present invention. The components shown in FIG. 4 that are the same as those shown in FIG. 1 will retain the same reference numerals. The same holds for the modifications that follow.

Referring to FIG. 4, in the ESD protection transistor 100 according to the first modification, the adjacent intervals between the drain contacts 106A to 106C are set at a value ranging from 1.1 to 5 times the design rule minimum, and the source contact 107 is formed as a single contact in a planar rectangular shape extending in the gate width direction. In this structure, it is desirable that the length of the source contact 107 in the gate width direction be set to include the distance between the drain contacts 106A and 106C provided on the drain region 104 and at both ends along the gate width direction. Note that the structure of the first modification is identical to the structure of the first embodiment except that the source contact 107 is provided instead of the source contacts 107A to 107E in the first embodiment shown in FIG. 1.

As mentioned above, even though the source contact 107 having a single planar rectangular shape and a large area is provided in the region facing the drain contacts 106A to 106C, local concentration of surge current can be prevented. Therefore, the level of the ESD tolerance of the ESD protection transistor 100 can be improved.

(Second Modification of First Embodiment)

Figure 5:
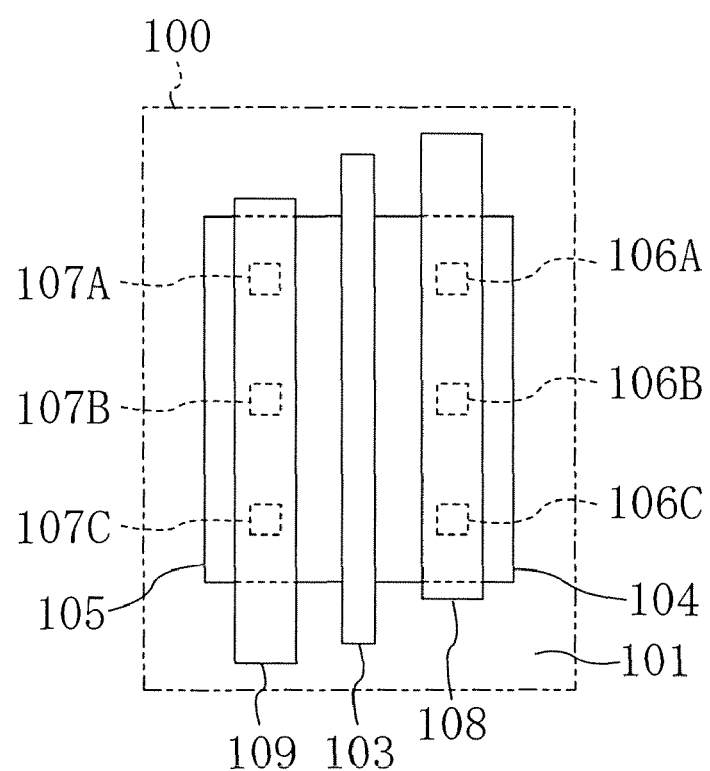
FIG. 5 is a schematic plan view showing an ESD protection transistor according to a second modification of the first embodiment of the present invention.

FIG. 5 shows a plan structure of an ESD protection transistor according to a second modification of the first embodiment of the present invention.

Referring to FIG. 5, in the ESD protection transistor 100 according to the second modification, the adjacent intervals between the source contacts 107A to 107C are set at a value ranging from 1.1 to 5 times the design rule minimum like those between the drain contacts 106A to 106C, and in addition the source contacts 107A to 107C and the drain contacts 106A to 106C have the same intervals. In other words, the source contacts 107A to 107C and the drain contacts 106A to 106C are arranged to have wider intervals between the adjacent contacts than the source contacts 157A to 157E and the drain contacts 156A to 156E of the logic transistor 150 shown in FIG. 2B, respectively.

Since the electric field of the source region 105 is typically lower than that of the drain region 104, current concentration is more difficult to cause in the source region 105 than in the drain region 104. However, the current concentration can be caused even in the source region 105, so that not only the intervals between the drain contacts 106A to 106C but also the adjacent intervals between the source contacts 107A to 107C are set at a value ranging from 1.1 to 5 times the design rule minimum.

This provides an increased resistance between the adjacent ones of the source contacts 107A to 107C, so that, for example, a current from the drain contact 106A or 106C can be inhibited from entering a current flowing between the drain contact 106B and the source contact 107B. As a result of this, current concentration on the source contacts 107A to 107C can be prevented more reliably, so that the ESD protection transistor 100 with a high ESD tolerance can be offered.

Note that the adjacent intervals between the drain contacts 106A to 106C do not necessarily have to be set at the same value as the adjacent intervals between the source contacts 107A to 107C.

(Third Modification of First Embodiment)

Figure 6:
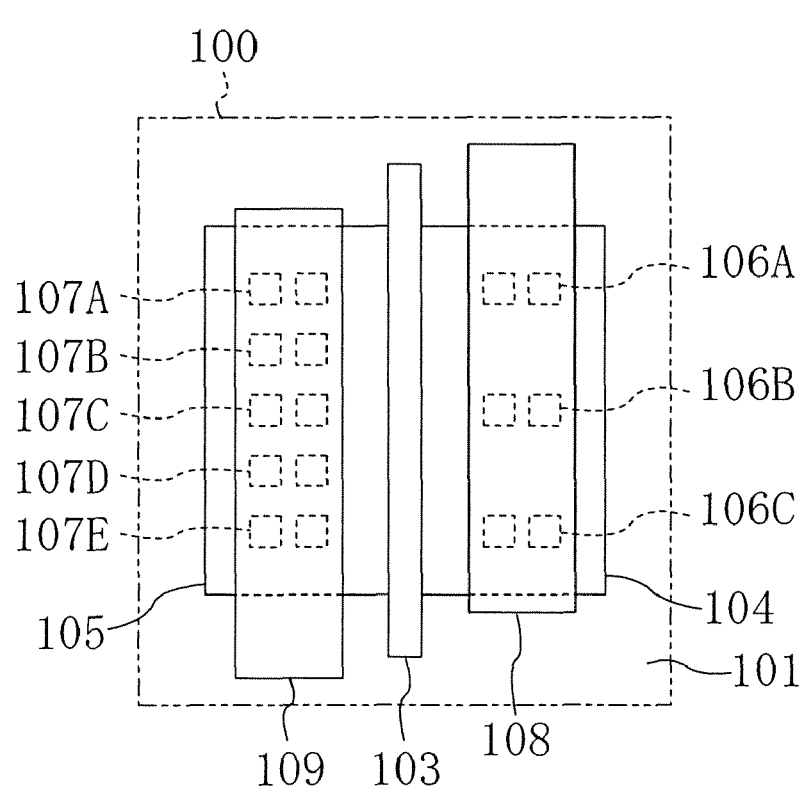
FIG. 6 is a schematic plan view showing an ESD protection transistor according to a third modification of the first embodiment of the present invention.

FIG. 6 shows a plan structure of an ESD protection transistor according to a third modification of the first embodiment of the present invention.

Referring to FIG. 6, in the ESD protection transistor 100 according to the third modification, a plurality of drain contacts 106A to 106C and a plurality of source contacts 107A to 107E are aligned, respectively, in two lines in parallel with the gate width direction. To be more specific, as compared with the structure of the first embodiment shown in FIG. 1, the structure of the third modification is constructed so that the drain contacts 106A to 106C and the source contacts 107A to 107E are arranged, respectively, in pairs in the gate length direction.

In this structure, the adjacent intervals between the drain contacts 106A to 106C in the gate width direction are set at a value ranging from 1.1 to 5 times the design rule minimum, and the adjacent intervals between the source contacts 107A to 107E in the gate width direction are set at the design rule minimum.

With such a construction, an applied current is split to flow into each of the drain contacts 106A to 106C and the source contacts 107A to 107E. This prevents breakdown of the drain contacts 106A to 106C and the source contacts 107A to 107E due to excessive current flow, for example, breaks therein due to electromigration or stress migration. Thus, the ESD protection transistor 100 with a high ESD tolerance can be offered.

Note that the drain contacts 106A to 106C and the source contacts 107A to 107E may be aligned, respectively, in three or more lines in parallel with the gate width direction.

The source contacts 107A to 107E do not necessarily have to be aligned in multiple lines, and may alternatively be aligned in only one line like FIG. 1.

(Fourth Modification of First Embodiment)

Figure 7:
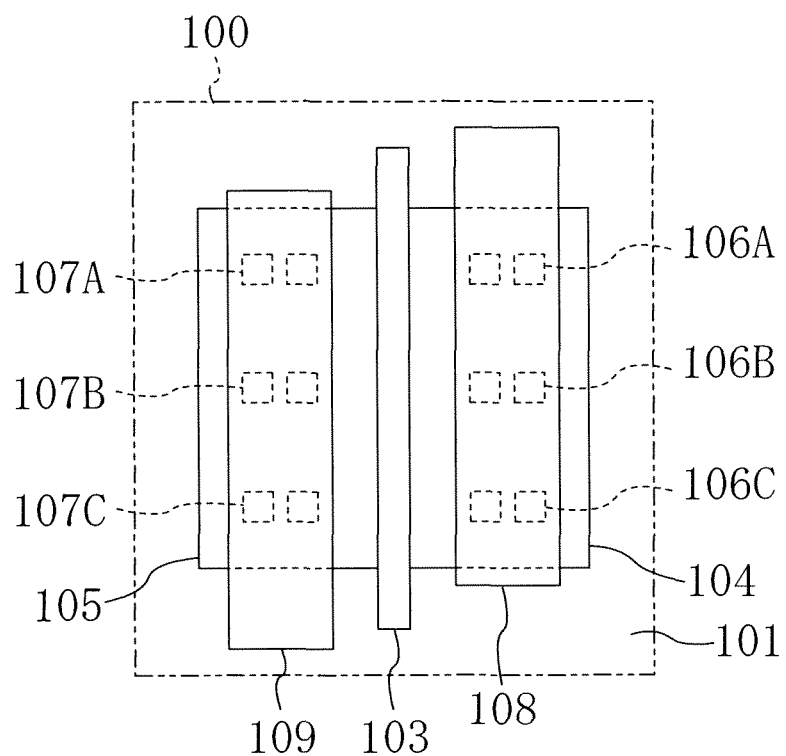
FIG. 7 is a schematic plan view showing an ESD protection transistor according to a fourth modification of the first embodiment of the present invention.

FIG. 7 shows a plan structure of an ESD protection transistor according to a fourth modification of the first embodiment of the present invention.

Referring to FIG. 7, in the ESD protection transistor 100 according to the fourth modification, a plurality of drain contacts 106A to 106C and a plurality of source contacts 107A to 107C are aligned, respectively, in two lines in parallel with the gate width direction. Furthermore, the adjacent intervals between the drain contacts 106A to 106C and between the source contacts 107A to 107C in the gate width direction are both set at a value ranging from 1.1 to 5 times the design rule minimum. To be more specific, as compared with the structure of the second modification of the first embodiment shown in FIG. 5, the structure of the fourth modification is constructed so that the drain contacts 106A to 106C and the source contacts 107A to 107C are arranged, respectively, in pairs in the gate length direction.

With such a structure, breakdown of the drain contacts 106A to 106C and the source contacts 107A to 107C due to excessive current flow can be prevented, and also current concentration on the source contacts 107A to 107C can be prevented more reliably. Therefore, the ESD protection transistor 100 with a high ESD tolerance can be offered.

(Fifth Modification of First Embodiment)

Figure 8:
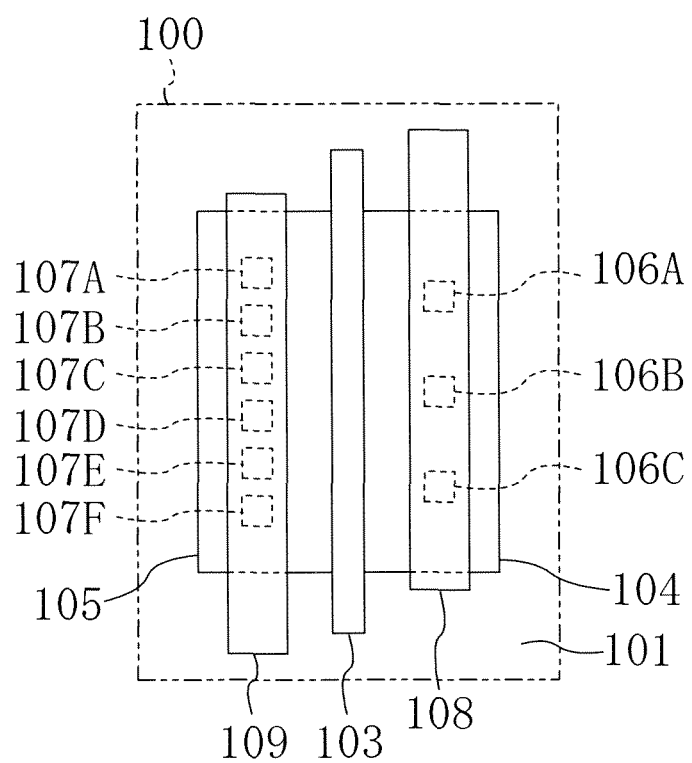
FIG. 8 is a schematic plan view showing an ESD protection transistor according to a fifth modification of the first embodiment of the present invention.

FIG. 8 shows a plan structure of an ESD protection transistor according to a fifth modification of the first embodiment of the present invention.

Referring to FIG. 8, in the ESD protection transistor 100 according to the fifth modification, the drain contacts 106A to 106C and the source contacts 107A to 107F are arranged so that with the gate electrode 103 interposed therebetween, the side surfaces of the drain contacts 106A to 106C do not face the side surfaces of the source contacts 107A to 107F. To be more specific, in the first embodiment shown in FIG. 1A, the side surfaces of the drain contacts 106A, 106B, and 106C are arranged to face the side surfaces of the source contacts 107A, 107C, and 107E, respectively. In contrast to this, in the fifth modification, the drain contact 106A is arranged to face the space between the source contacts 107A and 107B with the gate electrode 103 interposed therebetween, the drain contact 106B is arranged to face the space between the source contacts 107C and 107D with the gate electrode 103 interposed therebetween, and the drain contact 106C is arranged to face the space between the source contacts 107E and 107F with the gate electrode 103 interposed therebetween.

In this structure, the adjacent intervals between the drain contacts 106A to 106C in the gate width direction are set at a value ranging from 1.1 to 5 times the design rule minimum, and the adjacent intervals between the source contacts 107A to 107F in the gate width direction are set at the design rule minimum.

Note that the adjacent intervals between the source contacts 107A to 107F in the gate width direction may be set at a value ranging from 1.1 to 5 times the design rule minimum. Moreover, of the drain contacts 106A to 106C and the source contacts 107A to 107F, at least the drain contacts 106A to 106C may be aligned in multiple lines in parallel with the gate width direction as shown in FIG. 6.

With such a structure, for example, a current flowing between the drain contact 106A and the source contact 107A or 107B can be inhibited from entering a current flowing between the drain contact 106B and the source contact 107C or 107D. Therefore, the ESD protection transistor 100 with a high ESD tolerance can be offered.

(Sixth Modification of First Embodiment)

Figure 9:
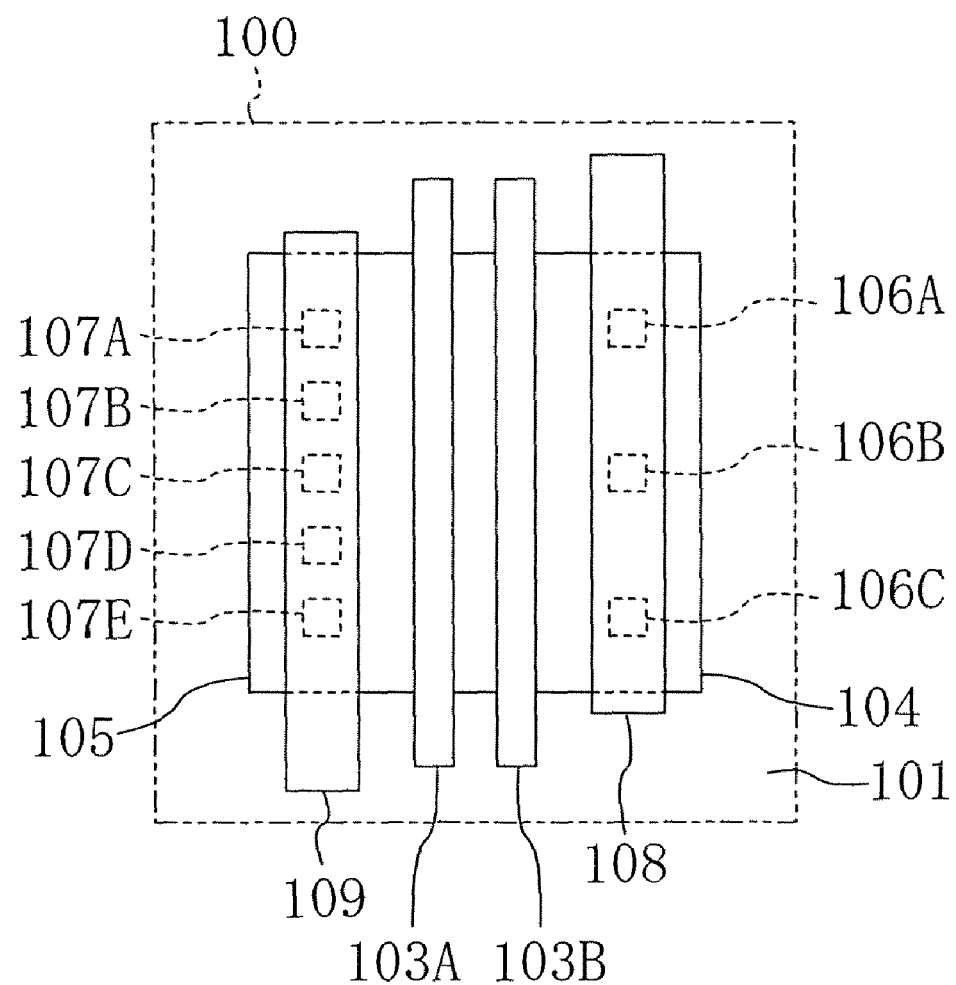
FIG. 9 is a schematic plan view showing an ESD protection transistor according to a sixth modification of the first embodiment of the present invention.

FIG. 9 shows a plan structure of an ESD protection transistor according to a sixth modification of the first embodiment of the present invention.

Referring to FIG. 9, in the ESD protection transistor 100 according to the sixth modification, two gate electrodes 103A and 103B are formed between and in parallel with the drain region 104 and the source region 105 to establish two-stage series connection of the transistors. That is to say, the transistor 100 in this modification is a so-called cascade transistor.

In this structure, the adjacent intervals between the drain contacts 106A to 106C in the gate width direction are set at a value ranging from 1.1 to 5 times the design rule minimum, and the adjacent intervals between the source contacts 107A to 107E in the gate width direction are set at the design rule minimum.

This provides an increased resistance between the adjacent ones of the drain contacts 106A to 106C, so that, for example, a current from the drain contact 106A or 106C can be inhibited from entering a current flowing between the drain contact 106B and the source contact 107C. Therefore, local current concentration on the source contact 107C can be prevented. As a result of this, the cascade-type ESD protection transistor 100 with a high ESD tolerance can be offered.

In the sixth modification, the transistor used is not limited to the two-stage cascade transistor. A multiple-stage cascade transistor such as a transistor with a three- or four-stage cascade connection is also useful in preventing local current concentration.

The ESD protection transistors 100 according to the second to fifth modifications can also employ the cascade-connection structure like the sixth modification.

Second Embodiment

A second embodiment of the present invention will be described with reference to the accompanying drawings.

Figure 10A:
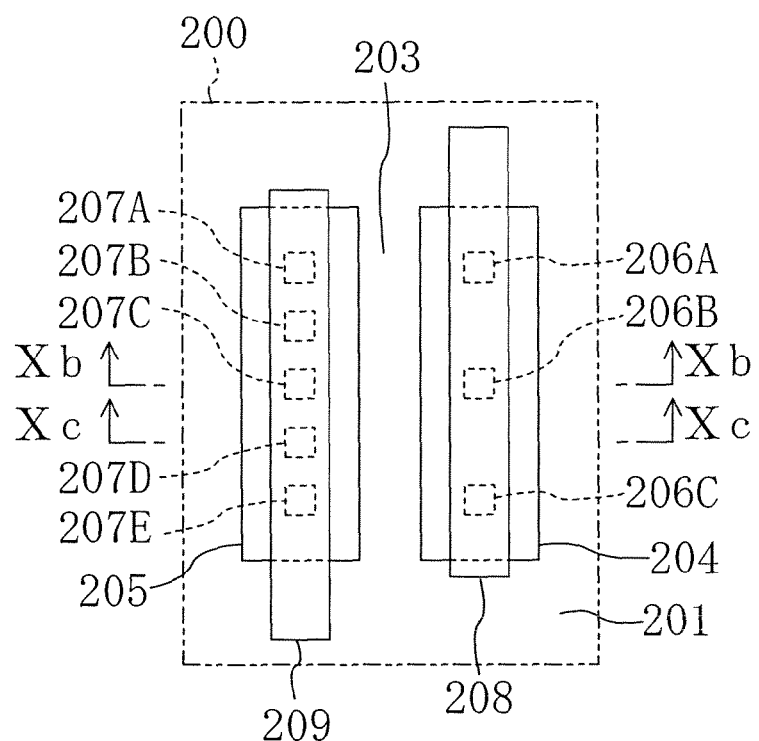
FIGS. 10A to 10C show an ESD protection transistor according to a second embodiment of the present invention.
Figure 10B:
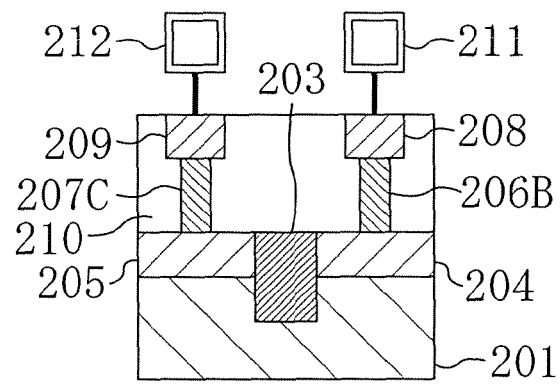
Figure 10C:
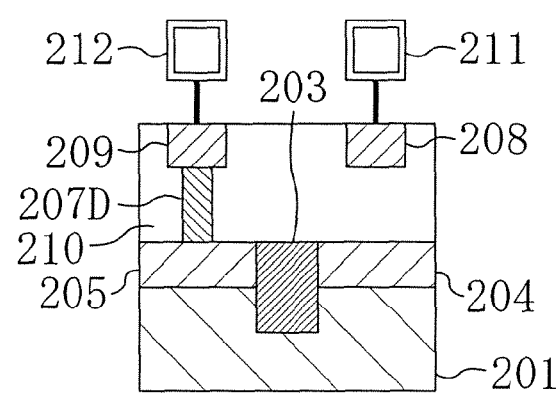

FIGS. 10A to 10C show an ESD protection transistor according to the second embodiment of the present invention. FIG. 10A shows a plan structure thereof, FIG. 10B shows a cross-sectional structure thereof taken along the line Xb-Xb in FIG. 10A, and FIG. 10C shows a cross-sectional structure thereof taken along the line Xc-Xc in FIG. 10A.

Referring to FIGS. 10A to 10C, an ESD protection transistor 200 according to the second embodiment is formed of an npn-type bipolar transistor, and includes: a p-type well region 201 formed in the upper portion of a semiconductor substrate (not shown) made of silicon or the like; and an n-type collector region 204 and an n-type emitter region 205 formed in the upper portion of the well region 201 and defined by an isolation region 203 of a silicon oxide or the like.

The well region 201 is formed, for example, by ion implantation of p-type impurity ions if the transistor belongs to the generation with 65 nm-design rules, has an impurity concentration of $1 \times 10^{17}$ cm$^{-3}$ to $7 \times 10^{17}$ cm$^{-3}$, and serves as a base region. The collector region 204 and the emitter region 205 are formed by ion implantation of n-type impurity ions, and have an impurity concentration of $1 \times 10^{17}$ cm$^{-3}$ to $1 \times 10^{18}$ cm$^{-3}$.

The collector region 204 is connected through a plurality of collector contacts 206A to 206C to a first metal interconnect 208. The plurality of collector contacts 206A to 206C are formed in an interlayer insulating film 210, and the first metal interconnect 208 makes connection to, for example, an input/output terminal (a pad for external connection) 211.

The emitter region 205 is connected through a plurality of emitter contacts 207A to 207E to a second metal interconnect 209. The plurality of emitter contacts 207A to 207E are formed in the interlayer insulating film 210, and the second metal interconnect 209 makes connection to a reference voltage terminal (for example, a ground terminal or a power supply terminal) 212.

Although a contact formation area of the base region is not shown, it is formed around the collector region 204 and the emitter region 205.

The plurality of collector contacts 206A to 206C and the plurality of emitter contacts 207A to 207E are spaced apart in the transistor width direction (the direction in parallel with the opposed surfaces of the collector region 204 and the emitter region 205). The intervals between the collector contacts 206A to 206C are set at a value greater than the design rule minimum (D.R.M.) of the contact, for example, 0.09 μm and not greater than five times the minimum, that is, 0.45 μm.

In contrast to this, the intervals between the emitter contacts 207A to 207E are set at a minimum contact interval, that is, 0.09 μm. Note that the adjacent intervals between the collector contacts 206A to 206C preferably range from 1.1 to 5 times the design rule minimum.

For example, the collector contacts 206A to 206C and the emitter contacts 207A to 207E each have a tungsten plug structure in which the contact hole is filled with tungsten with a barrier film of Ti/TiN interposed therebetween. The first and second metal interconnects 208 and 209 each have a damascene structure in which an interconnect groove provided in the interlayer insulating film 210 is filled with copper with a barrier film of TaN interposed therebetween.

In the second embodiment, the intervals between the collector contacts 206A to 206C are different from the intervals between the emitter contacts 207A to 207E. Therefore, the cross section of the emitter contact 207C taken along the base width direction (the direction perpendicular to the opposed surfaces of the collector region 204 and the emitter region 205) shown in FIG. 10B contains the collector contact 206B, while the cross section of the emitter contact 207D taken along the base width direction shown in FIG. 10C contains no collector contact.

In the second embodiment, the adjacent intervals between the plurality of collector contacts 206A to 206C formed in the transistor width direction are set at a value greater than the minimum for the contact design, for example, a value ranging from 1.1 to 5 times the minimum for the contact design. This provides an increased resistance between the adjacent ones of the collector contacts 206A to 206C. As a result of this, for example, a current from the collector contact 206A or 206C can be inhibited from entering a current flowing between the collector contact 206B and the emitter contact 207C, so that local current concentration on one emitter contact can be prevented. Therefore, a bipolar-type ESD protection transistor 200 with a high ESD tolerance can be offered.

Figure 11A:
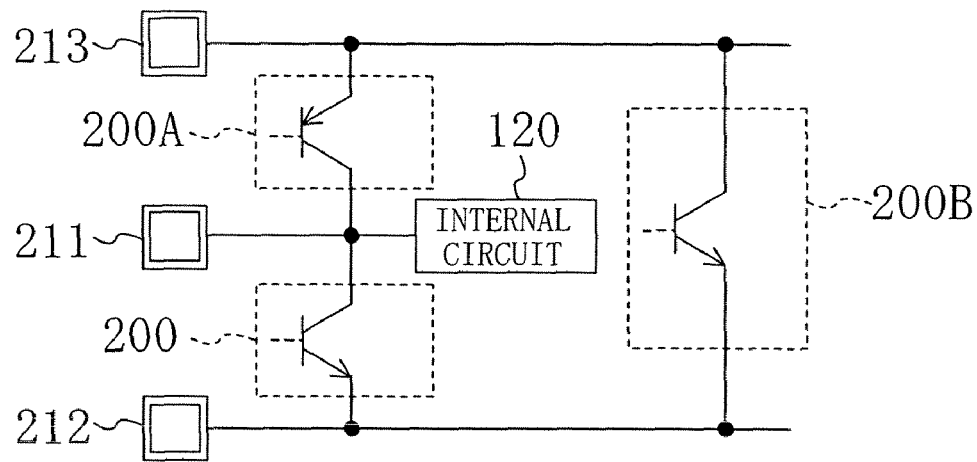
FIG. 11A is a circuit diagram showing main components of a semiconductor device including the ESD protection transistor according to the second embodiment of the present invention.

In the second embodiment, description has been made of the case where in the ESD protection transistor 200 formed of an npn-type bipolar transistor for protecting an internal circuit 120 in FIG. 11A from surge, the n-type collector region 204 is connected to the input/output terminal 211 and the n-type emitter region 205 is connected to the reference voltage terminal 212. However, the second embodiment is not limited to this case, and alternatively an ESD protection transistor formed of a pnp-type bipolar transistor may also have the like structure. In this case, it is sufficient that in the structure shown in FIG. 10A, the conductivity types of the well region 201, the collector region 204, and the emitter region 205 are n-type, p-type, and p-type, respectively. For example, a configuration as shown in FIG. 11A may be employed in which a pnp-type bipolar transistor as an ESD protection transistor 200A has a p-type collector region 204 connected to the input/output terminal 211 and a p-type emitter region 205 connected to a high-voltage terminal 213 and an npn-type bipolar transistor as an ESD protection transistor 200B has an n-type collector region 204 connected to the high-voltage terminal 213 and an n-type emitter region 205 connected to the reference voltage terminal 212.

Figure 11B:
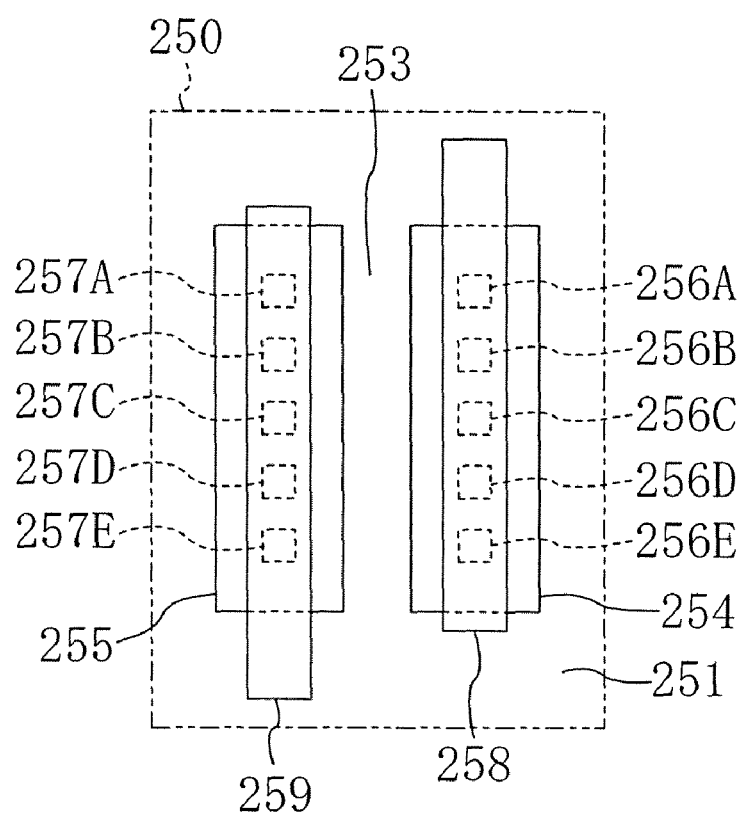
FIG. 11B is a plan view showing a transistor for a logic circuit constituting an internal circuit.

FIG. 11B shows a plan structure of a logic transistor 250 for, for example, a logic circuit incorporated into the internal circuit 120. Referring to FIG. 11B, the logic transistor 250 includes: a p-type well region 251 formed in the upper portion of the semiconductor substrate (not shown); and an n-type collector region 254 and an n-type emitter region 255 formed in the upper portion of the well region 251 and defined by an isolation region 253.

In the collector region 254, a plurality of collector contacts 256A to 256E are formed in the transistor width direction, and in the emitter region 255, a plurality of emitter contacts 257A to 257E are formed in the transistor width direction. The top ends of the collector contacts 256A to 256E are connected to a first metal interconnect 258, and the top ends of the emitter contacts 257A to 257E are connected to a second metal interconnect 259.

In this structure, the adjacent intervals between the collector contacts 256A to 256E and between the emitter contacts 257A to 257E are both set at the design rule minimum for the contact, for example, 0.09 μm.

Note that the transistor for a logic circuit is not limited to the bipolar transistor shown in FIG. 11B, and alternatively a field-effect transistor as shown in FIG. 2B may be employed.

(First Modification of Second Embodiment)

Figure 12:
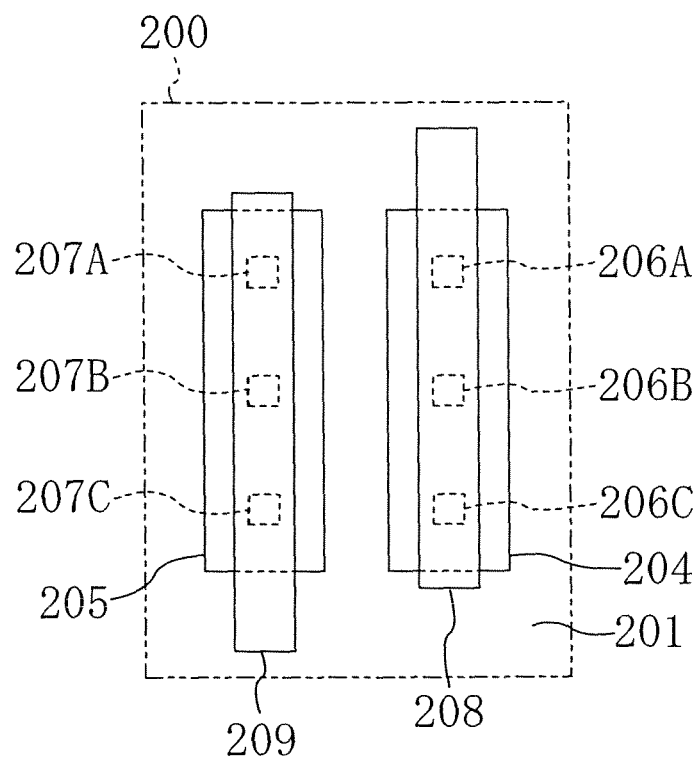
FIG. 12 is a schematic plan view showing an ESD protection transistor according to a first modification of the second embodiment of the present invention.

FIG. 12 shows a plan structure of an ESD protection transistor according to a first modification of the second embodiment of the present invention. The components shown in FIG. 12 that are the same as those shown in FIG. 10 will retain the same reference numerals. The same holds for the modifications that follow.

Referring to FIG. 12, the ESD protection transistor 200 according to the second modification is formed of an npn-type bipolar transistor, and the adjacent intervals between the emitter contacts 207A to 207C are set at a value ranging from 1.1 to 5 times the design rule minimum like those between the collector contacts 206A to 206C. In other words, the emitter contacts 207A to 207C and the collector contacts 206A to 206C are arranged to have wider intervals between the adjacent contacts than the emitter contacts 257A to 257E and the collector contacts 256A to 256E of the logic transistor 250 shown in FIG. 11B, respectively.

Since the electric field of the emitter region 205 is typically lower than that of the collector region 204, current concentration is more difficult to cause in the emitter region 205 than in the collector region 204. However, the current concentration can be caused even in the emitter region 205, so that not only the intervals between the collector contacts 206A to 206C but also the adjacent intervals between the emitter contacts 207A to 207C are set at a value ranging from 1.1 to 5 times the design rule minimum.

This provides an increased resistance between the adjacent ones of the emitter contacts 207A to 207C, so that, for example, a current from the collector contact 206A or 206C can be inhibited from entering a current flowing between the collector contact 206B and the emitter contact 207B. As a result of this, current concentration on the emitter contacts 207A to 207C can be prevented more reliably, so that the bipolar-type ESD protection transistor 200 with a high ESD tolerance can be offered.

(Second Modification of Second Embodiment)

Figure 13:
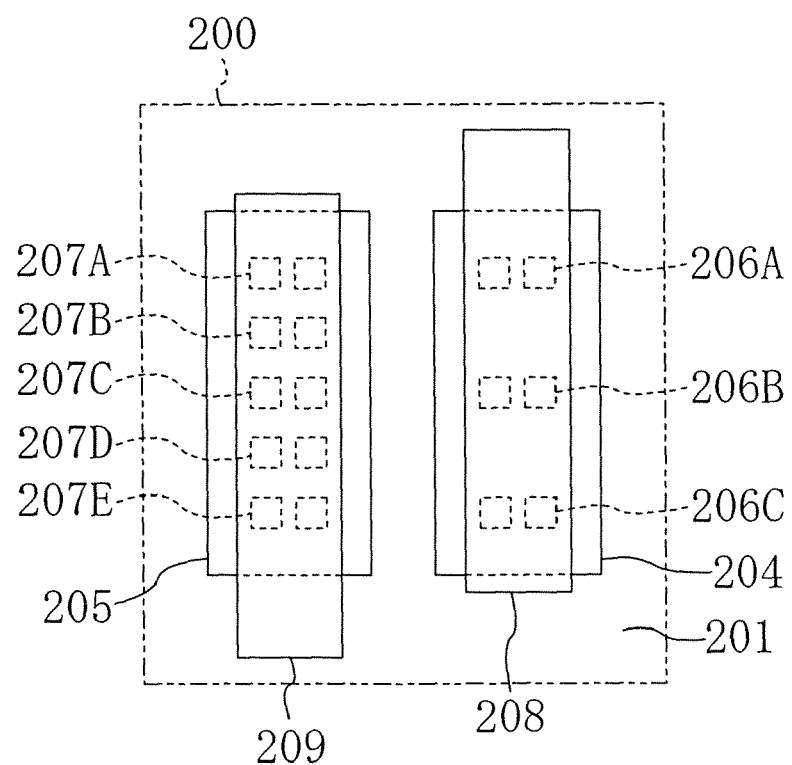
FIG. 13 is a schematic plan view showing an ESD protection transistor according to a second modification of the second embodiment of the present invention.

FIG. 13 shows a plan structure of an ESD protection transistor according to a second modification of the second embodiment of the present invention.

Referring to FIG. 13, in the ESD protection transistor 200 according to the third modification, a plurality of collector contacts 206A to 206C and a plurality of emitter contacts 207A to 207E are aligned, respectively, in two lines in parallel with the transistor width direction. To be more specific, as compared with the structure of the second embodiment shown in FIG. 10, the structure of the second modification is constructed so that the collector contacts 206A to 206C and the emitter contacts 207A to 207E are arranged, respectively, in pairs in the base width direction (the direction perpendicular to the opposed surfaces of the collector region 204 and the emitter region 205).

In this structure, the adjacent intervals between the collector contacts 206A to 206C in the transistor width direction are set at a value ranging from 1.1 to 5 times the design rule minimum, and the adjacent intervals between the emitter contacts 207A to 207E in the transistor width direction are set at the design rule minimum.

With such a construction, an applied current is split to flow into each of the collector contacts 206A to 206C and the emitter contacts 207A to 207E. This prevents breakdown of the collector contacts 206A to 206C and the emitter contacts 207A to 207E due to excessive current flow, for example, breaks therein due to electromigration or stress migration. Thus, the bipolar-type ESD protection transistor 200 with a high ESD tolerance can be offered.

Note that the emitter contacts 207A to 207E do not necessarily have to be aligned in two lines, and may alternatively be aligned in only one line like FIG. 10.

(Third Modification of Second Embodiment)

Figure 14:
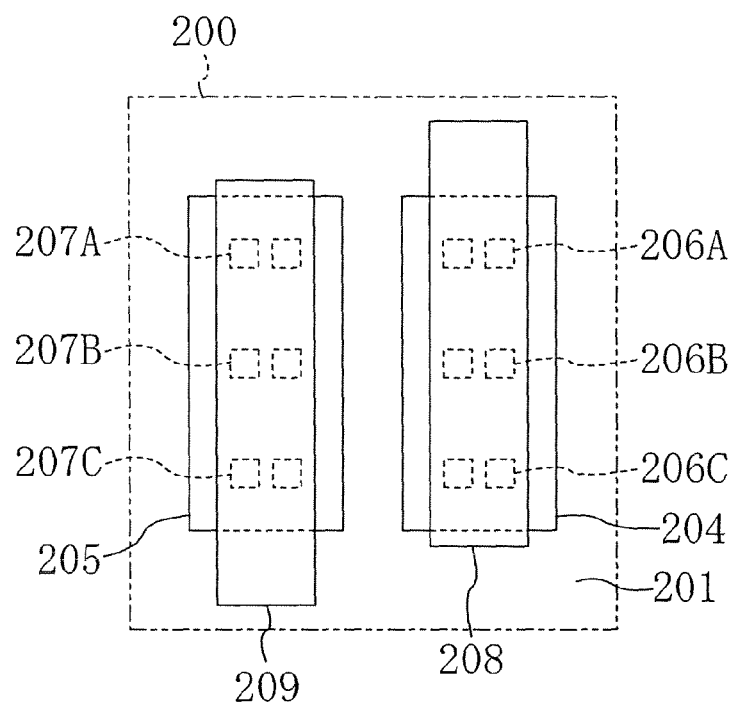
FIG. 14 is a schematic plan view showing an ESD protection transistor according to a third modification of the second embodiment of the present invention.

FIG. 14 shows a plan structure of an ESD protection transistor according to a third modification of the second embodiment of the present invention.

Referring to FIG. 14, in the ESD protection transistor 200 according to the third modification, a plurality of collector contacts 206A to 206C and a plurality of emitter contacts 207A to 207C are aligned, respectively, in two lines in parallel with the transistor width direction. Furthermore, the adjacent intervals between the collector contacts 206A to 206C and between the emitter contacts 207A to 207C in the transistor width direction are both set at a value ranging from 1.1 to 5 times the design rule minimum. To be more specific, as compared with the structure of the first modification of the second embodiment shown in FIG. 12, the structure of the third modification is constructed so that the collector contacts 206A to 206C and the emitter contacts 207A to 207C are arranged, respectively, in pairs in the base width direction (the direction perpendicular to the opposed surfaces of the collector region 204 and the emitter region 205).

With such a structure, breakdown of the collector contacts 206A to 206C and the source contacts 207A to 207C due to excessive current flow can be prevented, and also current concentration on the emitter contacts 207A to 207C can be prevented more reliably. Therefore, the bipolar-type ESD protection transistor 200 with a high ESD tolerance can be offered.

Up to this point, the present invention has been described using the first embodiment, the second embodiment, and the modifications of these embodiments. However, the present invention is not limited to the above embodiments and modifications. For example, in the first embodiment and its first to sixth modifications, the employed conductivity types of the well region 101, the drain region 104, and the source region 105 are p-type, n-type, and n-type, respectively, but the opposite types may be employed, that is, they may be n-type, p-type, and p-type, respectively.

Likewise, in the second embodiment and its first to third modifications, the employed conductivity types of the well region 201, the collector region 204, and the emitter region 205 are p-type, n-type, and n-type, respectively, but the opposite types may be employed, that is, they may be n-type, p-type, and p-type, respectively.

Figure 15:
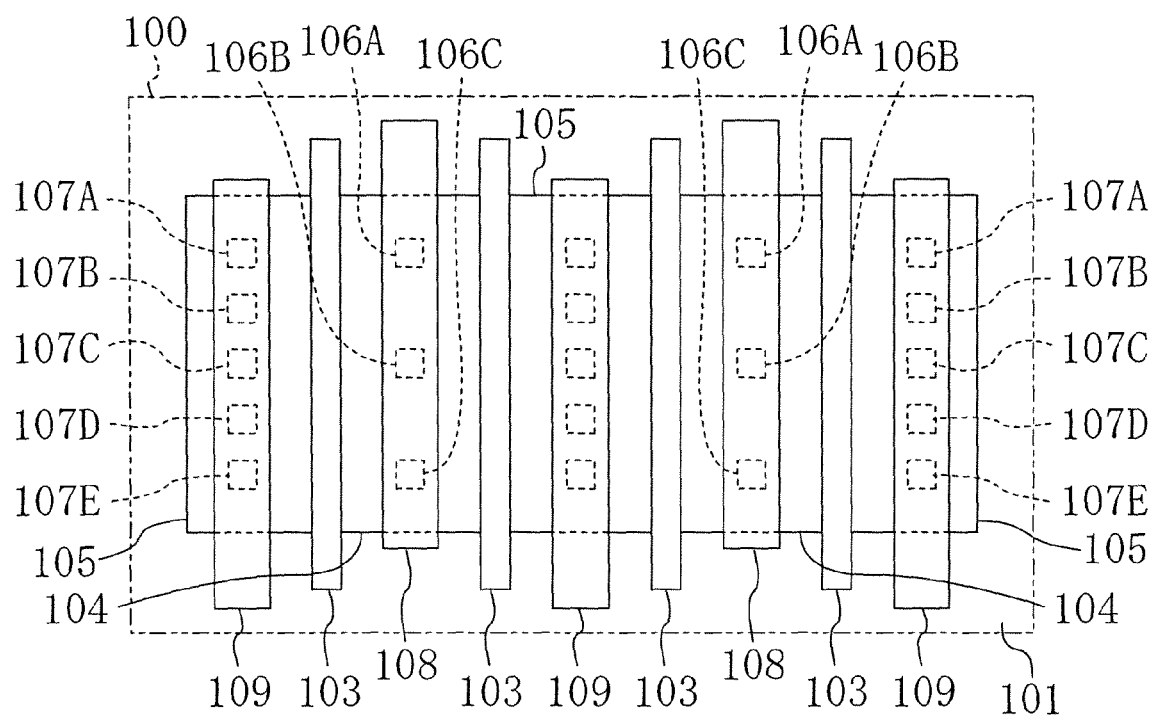
FIG. 15 is a schematic plan view showing an ESD protection transistor according to another modification of the first embodiment of the present invention.

In the first embodiment and its modifications, the ESD protection transistor 100 may be formed of two transistors having the drain region 104 shared therebetween. Moreover, as shown in FIG. 15, the transistor 100 may be formed of two or more transistors made by arranging the drain region 104 and the source region 105 alternately.

Figure 16:
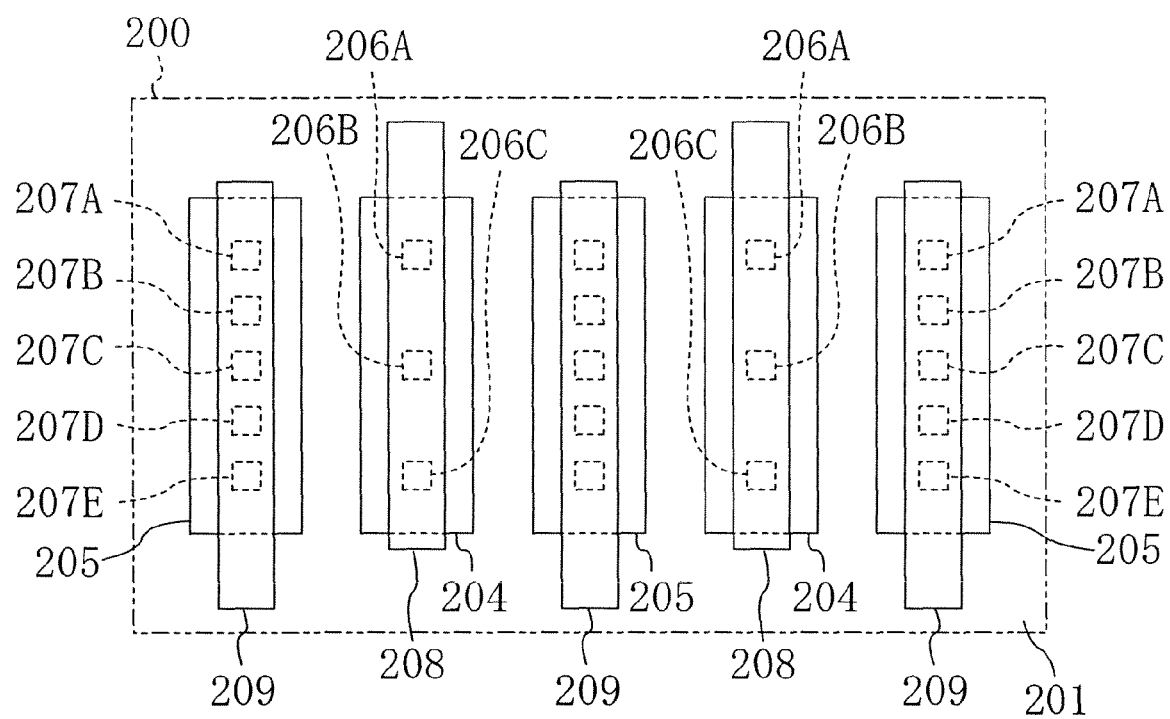
FIG. 16 is a schematic plan view showing an ESD protection transistor according to another modification of the second embodiment of the present invention.
Figure 17A:
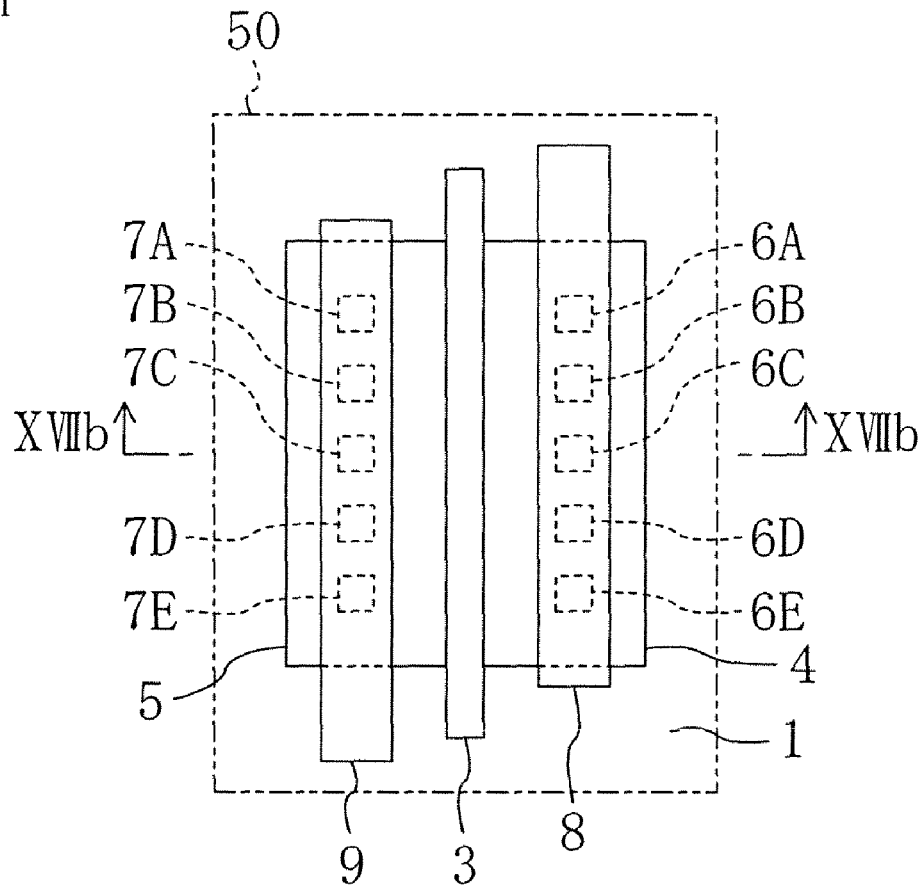
FIGS. 17A and 17B show a conventional ESD protection transistor.
Figure 17B:
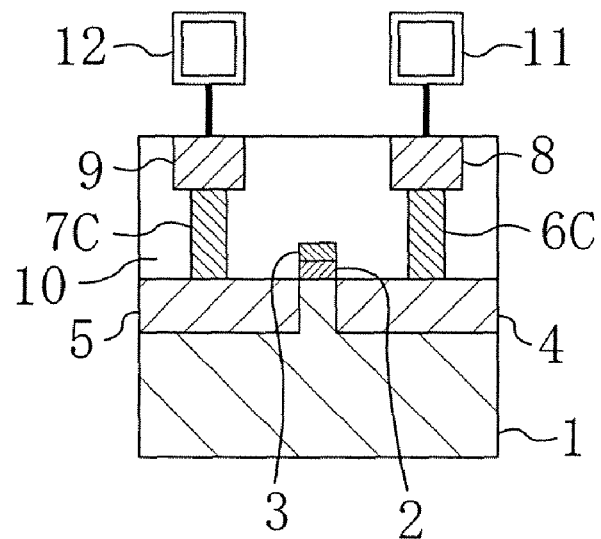

Likewise, in the second embodiment and its modifications, the ESD protection transistor 200 may be formed of two bipolar transistors having the collector region 204 shared therebetween. Moreover, as shown in FIG. 16, the transistor 200 may be formed of two or more bipolar transistors made by arranging the collector region 204 and the emitter region 205 alternately.

As described above, the semiconductor device according to the present invention can provide an ESD protection transistor with an improved ESD tolerance, and hence is useful for a semiconductor device and the like with an ESD protection transistor.

What is claimed is:

1. A semiconductor device comprising:
a well region of a first conductivity type formed in a semiconductor region;
a collector region of a second conductivity type and an emitter region of the second conductivity type formed in the well region;
a plurality of collector contacts formed on the collector region to be spaced apart in a width direction of a transistor; and
a plurality of emitter contacts formed on the emitter region to be spaced apart in the transistor width direction,
wherein the intervals between the collector contacts are greater than the intervals between the emitter contacts.

2. The device of claim 1,
wherein the plurality of collector contacts are aligned in multiple lines in parallel with the transistor width direction.

3. The device of claim 1,
wherein the plurality of emitter contacts are aligned in multiple lines in parallel with the transistor width direction.

4. A semiconductor device comprising:
a first transistor for electrostatic discharge protection; and
a second transistor constituting a logic circuit,
wherein the first transistor includes:
a well region of a first conductivity type formed in a first semiconductor region;
a collector region of a second conductivity type and an emitter region of the second conductivity type formed in the well region;
a plurality of collector contacts formed on the collector region to be spaced apart in a width direction of a transistor; and
at least one emitter contact formed on the emitter region;
the second transistor includes:
a first diffusion region and a second diffusion region formed in a second semiconductor region;
a plurality of first contacts formed to be spaced apart on the first diffusion region; and
a plurality of second contacts formed to be spaced apart on the second diffusion region, and
the intervals between the collector contacts are greater than the intervals between the first contacts and between the second contacts.

5. The device of claim 4,
wherein the at least one emitter contact comprises a plurality of emitter contacts, and the plurality of emitter contacts are formed to be spaced apart in the transistor width direction, and
the intervals between the emitter contacts are greater than the intervals between the first contacts and between the second contacts.

6. The device of claim 5,
wherein the plurality of emitter contacts are aligned in multiple lines in parallel with the transistor width direction.

7. The device of claim 6,
wherein the intervals between the collector contacts are from 1.1 times to 5 times of the intervals between the first contacts and between the second contacts, and the intervals between the emitter contacts are from 1.1 times to 5 times of the intervals between the first contacts and between the second contacts.

8. The device of claim 5,
wherein the intervals between the collector contacts are from 1.1 times to 5 times of the intervals between the first contacts and between the second contacts and the intervals between the emitter contacts are from 1.1 times to 5 times of the intervals between the first contacts and between the second contacts.

9. The device of claim 4,
wherein the plurality of collector contacts are aligned in multiple lines in parallel with the transistor width direction.

10. The device of claim 9,
wherein the intervals between the collector contacts are from 1.1 times to 5 times of the intervals between the first contacts and between the second contacts, and the intervals between the emitter contacts are equal to the intervals between the first contacts and between the second contacts.

11. The device of claim 4,
wherein the intervals between the collector contacts are from 1.1 times to 5 times of the intervals between the first contacts and between the second contacts.

12. The device of claim 4,
wherein the at least one emitter contact comprises a plurality of emitter contacts, and the plurality of emitter contacts are formed to be spaced apart in the width direction of the transistor, and
the intervals between the emitter contacts are equal to the intervals between the first contacts and between the second contacts.

13. The device of claim 12,
wherein the intervals between the collector contacts are from 1.1 times to 5 times of the intervals between the first contacts and between the second contacts.

* * * * *